(12) United States Patent
Oishi (10) Patent No.: US 8,083,552 B2
(45) Date of Patent: Dec. 27, 2011

(54) PROBE PIN (75) Inventor: Yoshitaka Oishi, Ulu Tiram (MY)

(73) Assignee: Test Tooling Solutions Group PTE., Ltd., Singapore (SG)

( * ) Notice: Subject to any disclaimer, the term of this patent is extended or adjusted under 35 U.S.C. 154(b) by 0 days.

(21) Appl. No.: 12/893,695

(22) Filed: Sep. 29, 2010

(65) Prior Publication Data

US 2011/0117796 A1 May 19, 2011

Related U.S. Application Data

(63) Continuation of application No. PCT/JP2009/069343, filed on Nov. 13, 2009.

(51) Int. Cl.
*H01R 13/24* (2006.01)

(52) U.S. Cl. ........................................ 439/700; 439/824

(58) Field of Classification Search .................. 439/482, 439/700, 824
See application file for complete search history.

(56) References Cited

U.S. PATENT DOCUMENTS

| 6,937,045 B2 * | 8/2005 | Sinclair .................... 324/755.05 |
| 2003/0176113 A1 * | 9/2003 | Sasaki ............................ 439/700 |
| 2004/0053539 A1 * | 3/2004 | Watanabe ..................... 439/700 |
| 2005/0227546 A1 * | 10/2005 | Sekiguchi ..................... 439/700 |
| 2008/0003888 A1 * | 1/2008 | Xu ................................. 439/700 |
| 2010/0197173 A1 * | 8/2010 | Tsunoda et al. ............... 439/700 |

FOREIGN PATENT DOCUMENTS

WO WO 2006/007440 A1 1/2006
* cited by examiner

*Primary Examiner* — Hien Vu
(74) *Attorney, Agent, or Firm* — Slater & Matsil, L.L.P.

(57) ABSTRACT

A probe pin includes a barrel having an internal space extending from one end to the other end, a plunger provided at the one end of the barrel, a plunger provided at the other end of the barrel, and a coil spring received in the barrel for supporting the plungers elastically. The coil spring includes a central portion having substantially same diameter, a first taper portion adjacent to one end of the central portion and having diameters decreased gradually, and a second taper portion adjacent to the other end of the central portion and having diameters decreased gradually.

13 Claims, 5 Drawing Sheets

PROBE PIN

This application is a continuation of co-pending International Application No. PCT/JP2009/069343, filed Nov. 13, 2009, which designated the United States and was not published in English, which application is hereby incorporated herein by reference.

TECHNICAL FIELD

The present invention relates to a probe pin, and more particularly, to the probe pin used for a socket and a probe card for tests.

BACKGROUND

Probe pins are mounted in a socket and a probe card as contacts to apply electrical signals or voltages to test objects. Generally, the probe pins include a hollow cylindrical barrel, a pair of plungers that is attached to both ends of the barrel, and a coil spring received in the barrel for supporting the plungers elastically. There are two types for such probe pins. One is a single-ended probe. One of the plungers slides in the axial direction of the barrel, and the other is a double-ended probe. Both plungers slide in the axial direction of the barrel.

Semiconductors are tested to test whether each device passes or fails before shipping as final products. For example, circuit elements in the semiconductor wafer are tested by the prove card using probe pins. A package, which includes plastic molding surrounding a semiconductor chip that was cut away from the wafer, is tested by the socket installing the probe pins.

For example, when a BGA (Ball Grid Array) type package is mounted in the socket, one plunger is contacted with the solder ball, and the other plunger is connected to an electrode or conductive land on the printed wiring board mounting the socket. Electrical signals are supplied with the electrodes on the printed wiring board from the test equipment and are provided to the solder balls from the other plunger to one plunger through the barrel. Electrical currents flowing on the probe pins are mostly paths from the plungers through the barrel, and these current paths determine substantial resistance of the probe pin.

High integration and high density of the semiconductor chip cause an increase in the number of solder balls (external terminals). The miniaturization of a package causes a narrowing of the pitch of the solder balls. Accordingly, the pitch of the probe pins mounted in the socket should be matched with that of the solder balls, so that the miniaturization of the probe pins is required. To miniaturize the probe pins, the diameter of the barrel should be reduced, and the diameter of the plunger should be reduced so as to be adjusted.

Increasing the number of probe pins mounted in the socket requires reducing electrical resistance of the probe pins naturally and minimizing the frustrations of the electrical resistances between the probe pins. Reducing the diameter of the barrel causes the barrel to increase the electrical resistance, and in addition, it becomes difficult to maintain stable contacts between the barrel and the plungers. The insufficient contacts between the barrel and the plungers result in increasing the resistance of the probe pins, and the unstable contacts cause a change in the resistance of the probe pins. Accordingly, stable and constant contact between the barrel and the plungers are needed.

To stabilize the contacts between the plungers and the barrel, it is effective to strengthen the contacting pressure of the plungers in the perpendicular direction with respect to the barrel surface. To perform this, the methods of improving the plunger or spring can be considered.

One typical method of improving the plunger is called bias-cut; the contacting surface of the plunger with the spring is cut so as to be sloped, thus the spring presses the plunger in the oblique direction with respect to the axis of the probe pin and the vertical pressure with respect to the barrel is strengthened.

Figure 1:
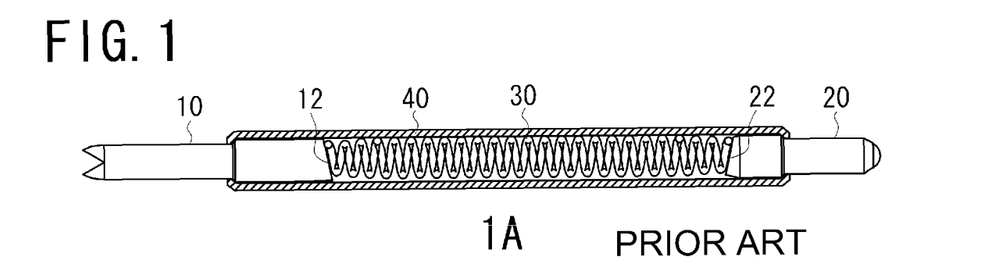
FIG. 1A is a schematic sectional view of a conventional probe pin with bias-cut type.
FIG. 1B is a schematic sectional view of a conventional probe pin with spring-offset type.

FIG. 1A shows a sectional view of the probe pin with a bias cut type. As illustrated in FIG. 1A, the probe pin includes a pair of plungers 10, 20, a spring 30 and a barrel 40. The surfaces 12, 22 of the plungers 10, 20 contacting with spring 30 are sloped. The axial force by the spring 30 presses the plungers 10, 20 vertically with respect to the axis direction and applies a constant pressure of contacts between the plungers 10, 20 and the barrel 40.

A method of improving a spring is described in WO 2006/007440 A1, which discloses a method to increase the vertical pressure of the plunger against the barrel by offsetting a central axis of the spring. As shown in FIG. 1B, the probe pin includes the plungers 10, 20, a spring 50 and the barrel 40. The contacting surfaces 14, 24 of the plungers 10, 20 are ordinary conical shape, namely, wedge type, while the spring 50 includes a first portion 52 having a first central axis and a second portion 54 having a second central axis, the second portion 54 is adjacent to the first portion 52 and its second central axis is offset from the first central axis. Such an offset spring 50 allows the plungers 10, 20 to be energized in the vertical direction with respect to the axis direction, thereby maintaining the stable contacts between the plungers 10, 20 and the barrel 40.

SUMMARY OF THE INVENTION

However, the conventional probe pin has the following problems. The probe pin with the bias cut as above mentioned requires particular operation by the automatic lathe machine, which are not only difficult but also expensive. On the other hand, in the case of the probe pin with the offset spring, the stress concentration occurs at the boundary area of the first and second portions 52, 54 of the spring 50. Especially, since the spring is compressed or extended in the axial direction by the slide of the plunger, the stresses applied at the boundary of the first and second portions 52, 54 repeatedly are different, thereby reducing the elasticity and the lifetime of the spring. Particularly, the reduction of the elasticity of the spring causes unstable contacts between the plungers and the barrel, resulting in increasing the electrical resistance of the probe pin.

The present invention intends to solve the above conventional problems and to provide a probe pin with reduction and stabilization of the electrical resistance and with improved lifetime.

A probe pin according to embodiments of the present invention includes a conductive housing having one end and the other end opposite the one end, and a space extending from the one end to the other end being formed internally. A first conductive plunger is provided at the one end, a second conductive plunger is provided at the other end, and a coil spring is received in the housing and supports at least one of the first and second plungers elastically. The coil spring includes a first coil portion having the substantially equal diameters of coils, and a second coil portion adjacent to one end of the first coil portion and having the gradually reduced diameters relative to the diameter of the first coil portion. The second coil portion extends diagonally from the first coil portion, and the end of the second coil portion is connected to the first plunger or the second plunger.

Preferably, the coil spring further includes a third coil portion adjacent to the other end of the first coil portion. The third coil portion has the gradually reduced diameters relative to the diameter of the first coil portion. The third coil portion extends diagonally from the first coil portion, and the end of the third coil portion is connected to the second plunger of the first plunger.

Preferably, a central axis of the second coil portion crosses a central axis of the first coil portion and a central axis of the third coil portion crosses the central axis of the first coil portion. Preferably, the second and third coil portions are extended to the same side relative to the central axis of the first coil portion. Preferably, the second and third coil portions are extended to opposite sides relative to the central axis of the first coil portion. Preferably, a first angle formed by the central axes of the first and second coil portions equals a second angle formed by the central axes of the first and third coil portions. Preferably, the coil spring is symmetrical with a centerline orthogonal to the central axis of the first coil portion. Preferably, the coil spring is rotationally symmetrical with a center of the central axis of the first coil portion.

Preferably, the first plunger includes a cylindrical first contact portion and a cylindrical first sliding portion having the same axis as that of the first contact portion, the first sliding portion is formed with a conical first abutting portion, the first abutting portion is connected to the end of the second coil portion or the third coil portion. Preferably, the second plunger includes a cylindrical second contact portion and a cylindrical second sliding portion having the same axis as that of the second contact portion, the second sliding portion is formed with a conical second abutting portion, and the second abutting portion connected to the end of the second coil portion or the third coil portion.

According to embodiments of the present invention, a probe pin is provided with reduced electrical resistance and suppressed fluctuation resistance and with improved life cycle, compared with the conventional probe pin. Furthermore, in the socket in which the probe pins are mounted, the variations of the electrical properties between probe pins can be reduced.

BRIEF DESCRIPTION OF THE DRAWINGS

FIGS. 2A-2C, collectively FIG. 2, are diagrams showing a probe pin according to a first embodiment of the present invention;

FIGS. 3A and 3B, collectively FIG. 3, are front and side views of the barrel shown in FIG. 2;

FIGS. 4A-4D, collectively FIG. 4, are front and side views of the plunger shown in FIG. 2;

FIGS. 5A-5C, collectively FIG. 5, are front and side views of the coil spring shown in FIG. 2;

FIGS. 9A-9C, collectively FIG. 9, are front and side views of the spring coil shown in FIG. 8.

The following reference numbers can be used in conjunction with the drawings:

100, 100A: Probe pin
110: Barrel (Housing)
112, 114: end
112A, 114A: opening
120, 130: plunger
122, 132: contact portion
124, 134: sliding portion
126, 136: contact point
128, 138: abutting portion
140, 200: coil spring
142, 202: central portion
144, 204: first taper portion
146, 206: second taper portion
C, C1, C2: central axis

DETAILED DESCRIPTION OF ILLUSTRATIVE EMBODIMENTS

Disclosed hereinafter are embodiments of the present invention with reference to the figures. As preferable embodiments, probe pins mounted in a socket for testing BGA packages are illustrated. It should be noted that the scale in the figures is represented to understand the present invention easily and it does not express the actual scale of probe pins.

Figure 2A:
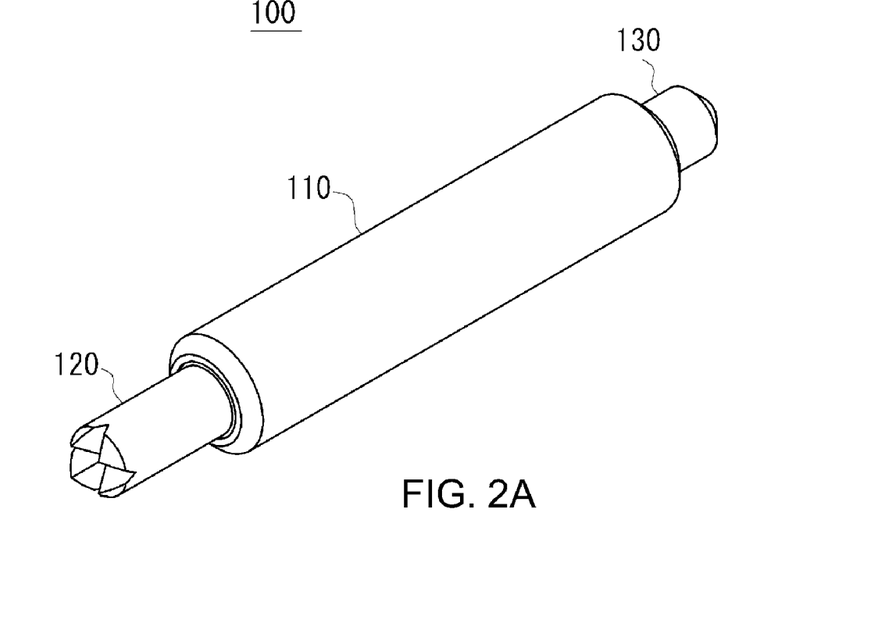
Figure 2B:
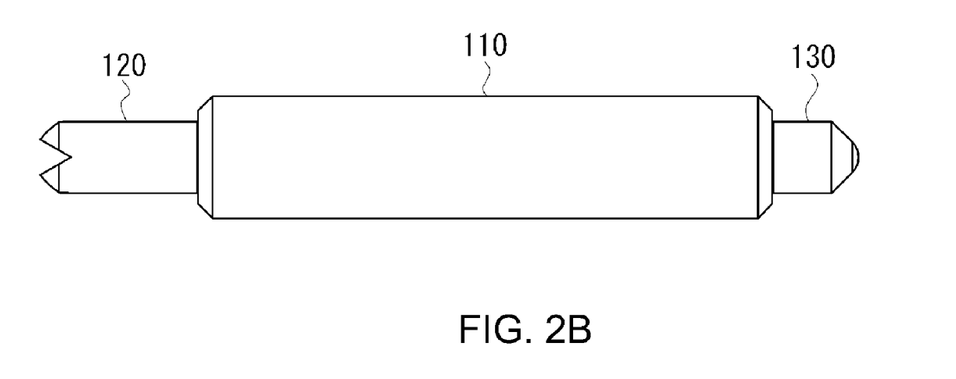
Figure 2C:
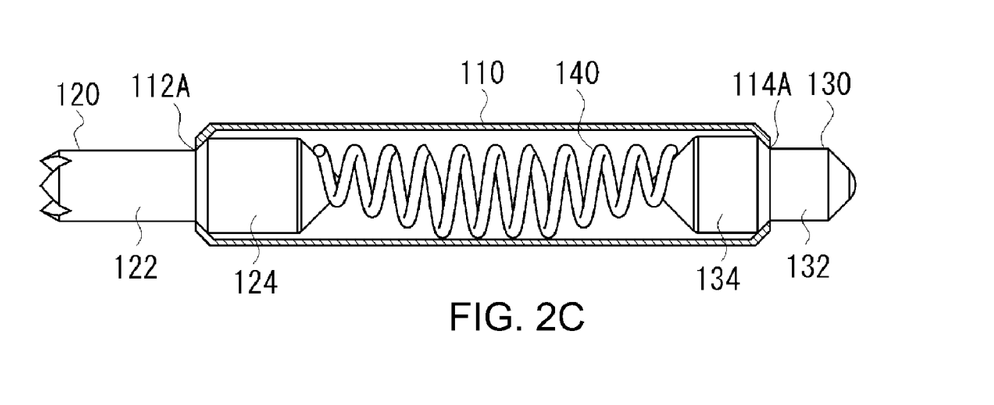
Figure 3A:
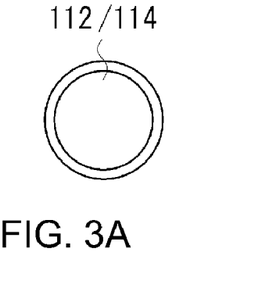
Figure 3B:
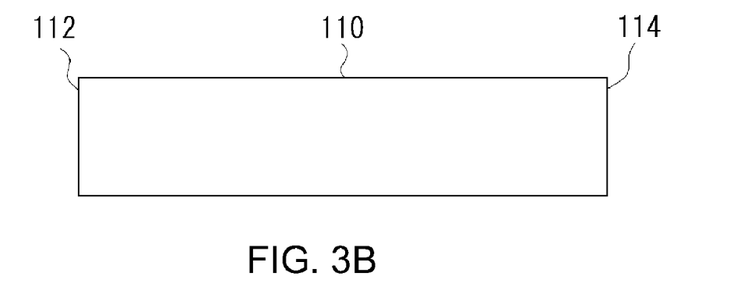

FIG. 2A is a perspective view of a probe pin according to a first embodiment of the present invention. FIG. 2B is a front view of the probe pin. FIG. 2C is a schematic sectional view of the axial direction of the probe pin. FIG. 3 to FIG. 5 are front and side views of the barrel, plungers and coil spring. The probe pin 100 according to the present embodiment includes a hollow cylindrical conductive barrel (housing) 110. A plunger 120 that is slideably received in one end of the barrel 110. A plunger 130 is slideably received in the other end of the barrel 110. A coil spring 140 is received in the barrel 110 for supporting the plungers 120, 130 elastically. The probe pin 100 disclosed herein is a double-ended probe, whose both plungers can be slid.

As illustrated in the FIG. 3, the barrel 110 includes one end 112 and an opposite end 114. A cylindrical space extending from one end 112 to the other end 114 is formed inside the barrel 110. The barrel 110 is, for example, made of conductive metal materials that are copper alloy, such as phosphor bronze and brass. Preferably, the electrical resistance of the barrel 110 may be reduced by plating the periphery of the barrel 110 with gold. Both ends 112, 114 of the barrel 110 are caulked, as described hereinafter, for forming stoppers for plungers 120, 130 inserted thereto.

Figure 4A:
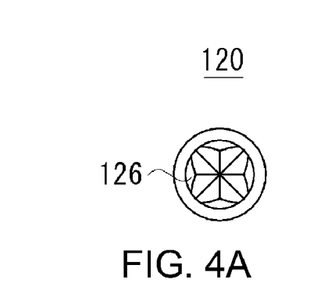
Figure 4B:
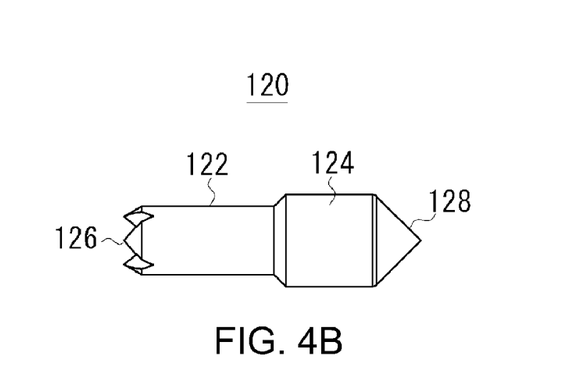
Figure 5A:
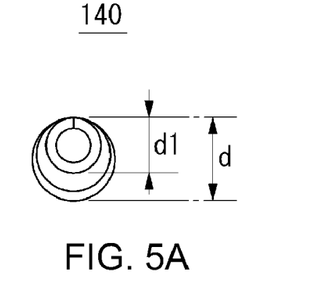
Figure 5B:
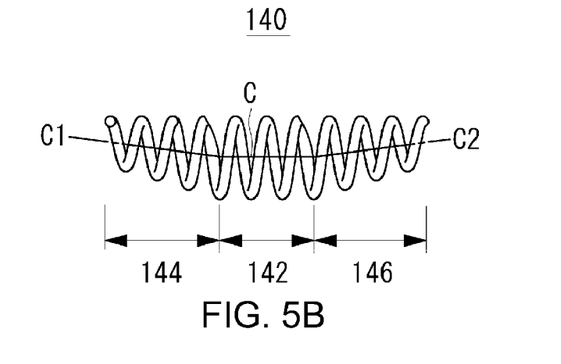
Figure 5C:
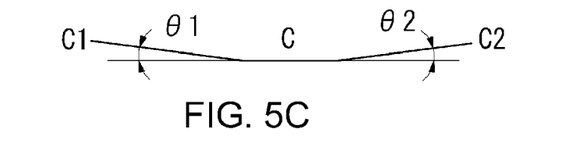

The plunger 120 illustrated in the side view in FIG. 4A and in end-view in FIG. 4B. The plunger 120 includes a cylindrical contact portion 122 with a relatively small diameter and a cylindrical sliding portion 124 adjacent to the contact portion 122 and having a diameter greater than that of the contact portion 122. The contact portion 122 and sliding portion 124 have the same central axis each other. The diameter of the sliding portion 124 is slightly smaller than the internal diameter of the barrel 110 and is greater than that of the opening 112A caulked at the end 112 of the barrel 110. According to this, the movement of sliding portion 124 is restricted by the opening 112A caulked at the end 112 and only the contact portion 122 can be projected from the end 112.

In this embodiment, it is assumed that the contact portion 122 projected from the barrel 110 is contacted with the solder balls with a spherical type of BGA package. A plurality of triangular edged contacts 126 are formed at the end contact portion 122 and a recession is formed in the center of the contact portion 122. The recession serves as the clearance for preventing the lowest surface of the solder ball from being deformed when the contact portion 122 contacts with the solder ball. The oxide coatings formed on the solder balls are thrust by the contacts 126 easily since they are edged, thereby ensuring the electrical contact between the contacts 126 and the BGA.

The sliding portion 124 is received in the internal space of the barrel 110 and can slide in the axial direction in the barrel 110. A conical-wedge-type abutting portion 128 having the same axis as the sliding portion 124 is formed at the end of sliding portion 124. The abutting portion 128 is abutted to one of the final ends of the coil spring 140.

Figure 4C:
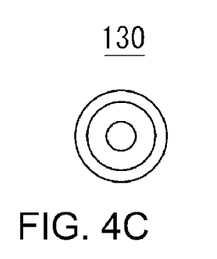
Figure 4D:
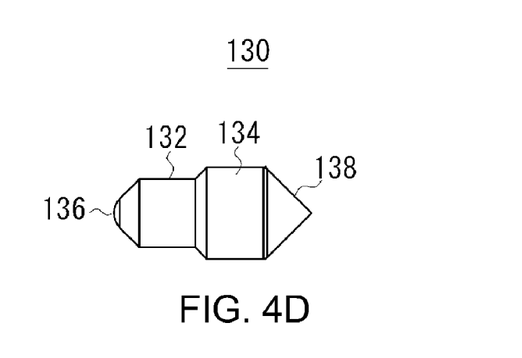

Another plunger 130 is illustrated in the side-view in FIG. 4C and in end-view in FIG. 4D. The plunger 130 includes a cylindrical contact portion 132 with a relatively small diameter and a sliding portion 134 adjacent to the contact portion 132 and having a diameter greater than that of the contact portion 132. The contact portion 132 and the sliding portion 134 have the same axis as each other. The diameter of sliding portion 134 is slightly smaller than that of the internal diameter of the barrel 110 and is greater than that of opening 114A caulked at the end 114 of the barrel 110. Therefore, the movement of sliding portion 134 is restricted by the opening 114A caulked at the end 114 and only the contact portion 132 can be projected from the end 114.

In this embodiment, it is assumed that the contact portion 132 projected from the other end of barrel 110 contacts with an electrode or a conductive land having a flat surface on the printed wiring board. By this assumption, a sharp conical contact 136 having the same axis as the contact portion 132 is formed on the edge of the contact portion 132. Also, a conical wedge-type abutting portion 138 having the same axis as the sliding portion 134 is formed on the end of sliding portion 134. The abutting portion 138 is contacted with the other final end of the coil spring 140. The plungers 120 and 130 are made of conductive metal materials that are copper alloy, such as phosphor bronze and brass. The periphery of plungers 120 and 130 can be plated with gold to reduce the electrical resistance.

The coil spring 140, as illustrated in FIG. 5, includes a central portion 142 that has plural coils with the same diameter d formed continuously. A first taper portion 144 is adjacent to one end of central portion 142, and a second taper portion 146 is adjacent to the other end of central portion 142. The coil spring 140 of the embodiment is applied with a relatively small number of wire turns. However, the number of wire turns of a coil can be selected in accordance with the design of necessary spring force and the like.

The first taper portion 144 is in a region where the diameters of the coils become gradually smaller than that of the central portion 142 and the central axis is diagonally or obliquely offset relative to the central axis of central portion 142. As shown in FIG. 5B the diameter d1 of the final coil in the first taper portion 144 is smaller than the diameter d in the central portion 142, and the diameter d1 is also one of the final ends of the coil spring 140. Accordingly, the first taper portion 144 includes a plurality of coils whose diameters become gradually smaller from the diameter d to the diameter d1. In addition, assuming the central axis of the central portion 142 is C and the central axis of the first taper portion 144 is C1, the central axis C1 crosses the central axis C at an angle θ1 (θ1 is not 0 degree) as shown in FIG. 5C. It should be noted that the central axis C1 can be represented as a line that connects centers of each coil of the first taper portion 144 or as a curve coming near the such line The second taper portion 146 is a region that the diameters of the coils become gradually smaller opposite to the first taper portion 144 relative to the central portion 142 and that the central axis is diagonally or obliquely offset relative to the central axis of the central portion 142. The diameter d2 (not shown) of the final coil in the second taper portion 146 is smaller than the diameter d in the central portion 142, and is also the other final end of the coil spring 140. The second taper portion 146 as well as the first taper portion 144 includes a plurality of the coils whose diameters are gradually smaller. Assuming the central axis of the central portion 142 is C and the central axis of the second taper potion 146 is C2, the central axis C2 crosses the central axis C at an angle θ2 (θ2 is not 0). It should be noted that the central axis C2 can be represented as a line that connects centers of each coil of the second taper portion 146 or a curve coming near the such line.

In preferred examples, d1=d2, θ1=θ2, and the first and second taper portions 144, 146 have the same number of wire turns, so that the coil spring 140 is symmetrical with respect to a line orthogonal to the central axis C of central portion 142. If the coil spring 140 is symmetrical, the coil spring 140 has no orientation, thus the assemble of the coil spring 140 into the barrel 110 is simplified.

Now, steps of assembling the probe pin are explained with reference to the FIG. 2C. The coil spring 140 is inserted into the barrel 110 and the plungers 120, 130 are inserted from the both ends of the barrel 110. After that, both ends 112, 114 are caulked to form the circular openings 112A, 114A. At this time, the coil spring 140 within the barrel 110 is slightly compressed in comparison with its free condition without load. Therefore, the plungers 120, 130 are urged by the coil spring 140 and stopped by the openings 112A, 114A. Since the coil spring 140 is symmetrical, it does not have any direction for the barrel and the plungers. This allows the assembly of the probe pins to be easy and quick.

Figure 6:
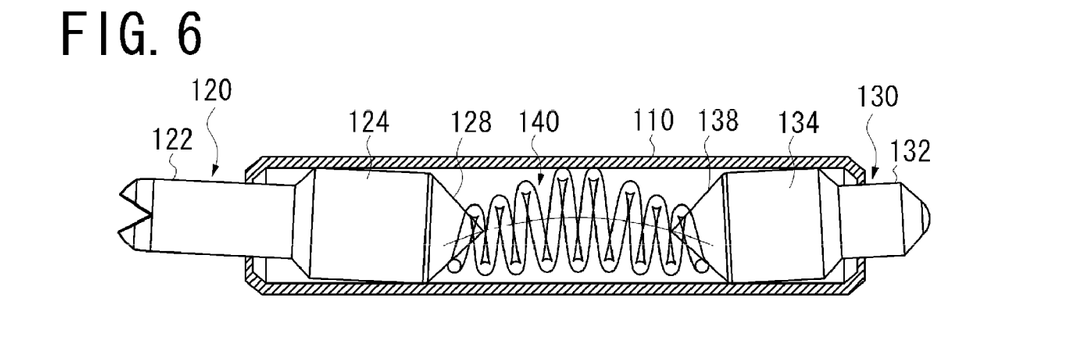
FIG. 6 is a schematic sectional view for explaining the operation of the probe pin of the first embodiment, and the declined plunger is represented.

The abutting portion 128 of plunger 120 is contacted with the final end of the first taper portion 144 of the coil spring 140 and the end of abutting portion 128 is inserted into the coils of the first taper portion 144 at a predetermined depth. Similarly, the abutting portion 138 of plunger 130 is contacted with the final end of second taper portion 146 of the coil spring 140 and the end of abutting portion 138 is inserted into the coils of the second taper portion 146 at a predetermined depth. At this time, the plungers 120, 130 are provided with loads in the inclined direction relative to the axial direction of barrel 110 by the first and second taper portions 144, 146, which results in the inclined plungers 120, 130. FIG. 6 illustrates this condition.

The central axes of the plungers 120, 130 almost coincide with the axis of the barrel 110 as well as of the central portion 142. However, since the first and second taper portions 144, 146 are offset in the diagonal direction relative to the central portion 142, the sliding portions 124, 134 of each plunger 120, 130 are urged in the opposite direction to the offset direction. Accordingly, the plungers 120, 130 are inclined in the opposite direction to the inclined directions of the first and second taper portions 144, 146, the sliding portions 124, 134 are contacted with the inner wall of barrel 110 with a constant pressure.

When the plunger 120 is contacted with the solder ball the plunger 120 slides inside the barrel 110 against the spring force of the coil spring 140. Since the sliding portion 124 is urged by the first taper portion 144, the sliding portion 124 is kept in contact with the inner wall of the barrel 110. The plunger 130 is also acted on similarly. Accordingly, it is restricted to increase the electrical resistance of the probe pin, so that the resistance is stabilized.

The coil spring according to this embodiment has the offset central axes of the first and second taper potions which are not parallel to the central axis of the central portion, and moreover the diameters of the coils of the first and second taper portions are designed to be gradually reduced. Thus it can be prohibited to concentrate the stress on the coil spring. Thereby the life cycle of the coil spring is improved. Additionally, since the coil spring of this embodiment changes its diameters of coils continuously, that is, since the diameter d1 of the first taper portion changes to the diameter d of the central portion and the diameter d changes to the diameter d2 of the second taper portion, the manufacturing of the coil spring is facilitated and the manufacturing cost of the coil spring is reduced.

Figure 7:
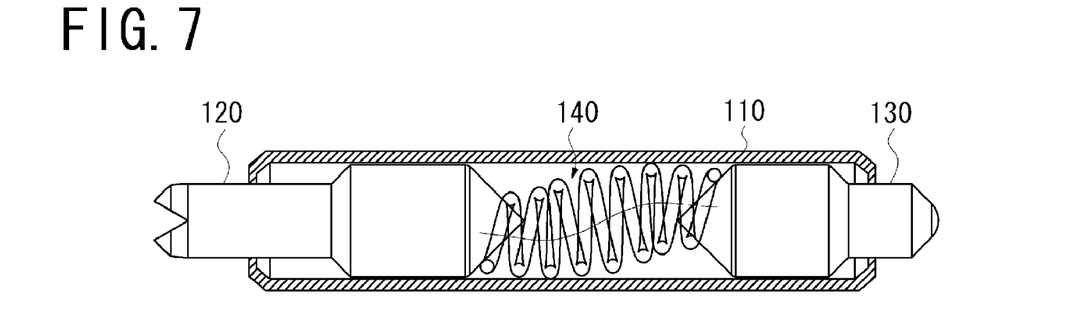
FIG. 7 is a schematic sectional view showing the exemplification of the first embodiment that taper portions of the spring coil is inclined at different direction of 180 angles.

Also, the probe pin in this embodiment employs the coil spring with a relatively small number of wire turns, so that the first taper portion 144 and the second taper portion 146 are inclined to the same side (looking at the same plane) relative to the central axis of the central portion 142. If the number of the wire turns is small, the axial length of the coil of the central portion 142 results in a short length. As illustrated in FIG. 7, if the direction of first taper portion 144 is different from that of the second taper portion 146 by 180 degree, the central portion 142 of the shorter axial length can not keep its whole spring parallel to the axis of the barrel, and the spring itself is forced to be inclined in the barrel. That is, the offset taper might not support the plungers with the effective inclined angle. Therefore, it is desirable that the first taper portion 144 and the second taper portion 146 are inclined at the same side relative to the central portion 142. It should be noted that if the central portion 142 could be kept in parallel with the axis of the barrel, it is not necessary for the first taper portion 144 and second taper portion 146 to extend from the central portion 142 to the same side.

Figure 8:
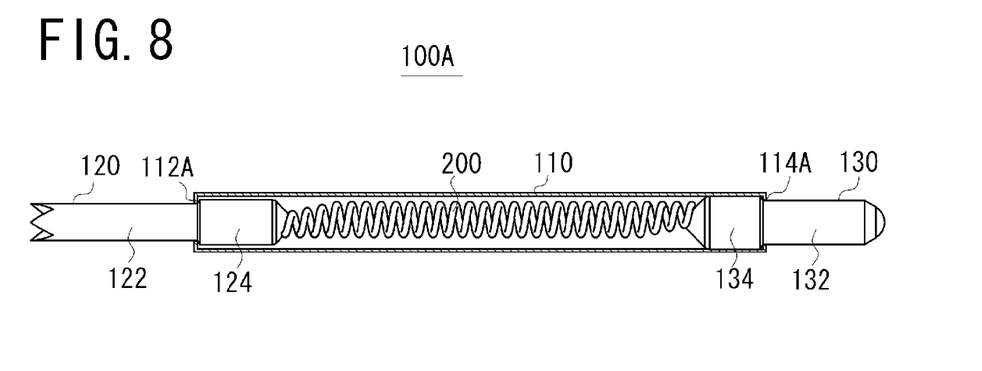
FIG. 8 is a schematic sectional view of the probe pin according to a second embodiment of the present invention.

Secondly, the second embodiment of the present invention is explained. FIG. 8 shows a schematic sectional view of the probe pin 100A according to the second embodiment. The probe pin 100A according to the second embodiment has substantially the same structure as illustrated in the first embodiment, except for the structure of the coil spring. It should be noted that the diameters of the barrel 110 and of the plungers 120, 130 in the probe pin 100A according to this embodiment are designed to be smaller than that of the first embodiment so as to fit the more fine pitch, and the number of wire turns of the coil spring is greater than that of the first embodiment.

Figure 9A:
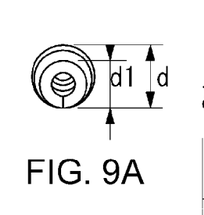
Figure 9B:
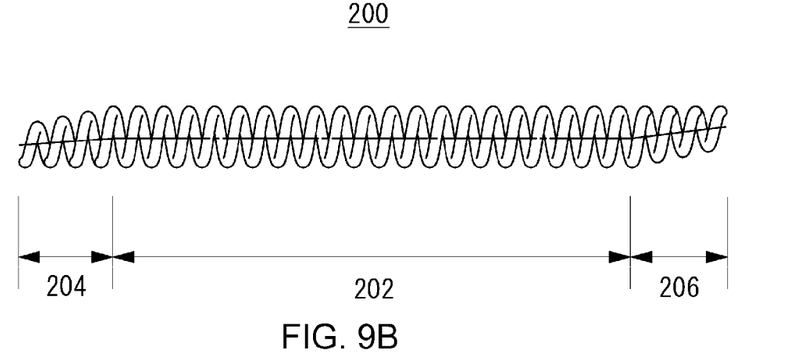
Figure 9C:
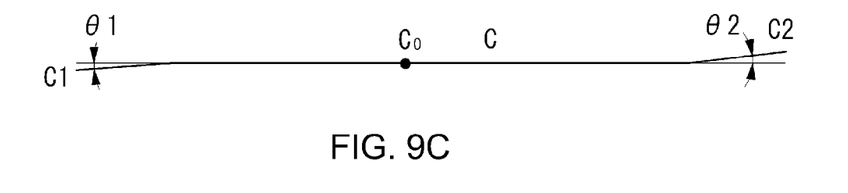

The coil spring 200 according to the second embodiment, as illustrated in FIG. 9, includes a central portion 202 in which each diameter d of the coils is equal and this continues, a first taper portion 204 adjacent to one end of the central portion 202, in which the diameters of the coils are decreased gradually, and a second taper portion 206 adjacent to the other end of central portion 202, in which the diameters of the coils are decreased gradually.

The first taper portion 204 is an area where the diameter d of the coil is decreased gradually from the central portion 202 and the central axis C1 is diagonally offset from the central axis C of the central portion 202. As shown in FIG. 9A, the diameter d1 of the final coil in the first taper portion 204 is smaller than the diameter d, the diameter d1 is also one end of the coil spring 200. That is, the first taper portion 204 includes a plurality of coils whose diameters are gradually smaller from diameter d to diameter d1. Additionally, assuming the central axis of central portion 202 is C and the central axis of first taper portion 204 is C1, the central axis C1 crosses the central axis C at the angle of $\Theta 1$ ($\Theta 1$ is not 0), as shown in FIG. 9C. It should be noted that the central axis C1 can be represented as a line that connects the centers of each coil of the first taper portion 204 or can be a curve coming near the line.

The second taper portion 206 is adjacent to the other end of central portion 202 and is an area where the diameters of the coils are reduced gradually and the central axis C2 is diagonally offset from the central axis C in central portion 202. The diameter d2 of the final coil in the second taper potion 206 is smaller than the diameter d, the diameter d2 is also the other end of the coil spring 200. The second taper portion 206 includes a plurality of coils whose diameters are gradually reduced from the diameter d to the diameter d2.

Additionally, assuming the central axis of the second taper portion 206 is C2, the central axis C2 crosses with the central axis C at the angle $\Theta 2$ ($\Theta 2$ is not 0). It should be noted that the central axis C2 can be represented as a line that connects the centers of each coil of the second taper portion 206 or can be as a curved line coming near the line.

In the first embodiment, the coil spring 140 is the symmetry that the first and second taper portions 144, 146 in the coil spring 140 are offset at the same side relative to the central axis C, on the other hand, in the second embodiment, the first and second taper portions 204, 206 are offset at different or opposite sides relative to the central axis C. As an example, assuming d1=d2, $\Theta 1=\Theta 2$, and respective number of the wire turns of the coils (the axial length) of the first and second taper portions 204, 206 is the same, the coil spring 200 can be rotationally symmetrical by 180 degree relative to the center point $C_0$ of the central axis C of the central portion 202.

The probe pin 100A is assembled in the same way as in the first embodiment, and the sliding portions 124, 134 are stopped by the openings 112A, 114A of each end of the barrel 110 such that the plungers 120, 130 are energized by the coil spring 200. The central axes of the abutting portions 128, 138 of the plungers 120, 130 almost coincide with the central axis of the barrel 110 and the central axis C of the central portion 202 of the coil spring 200, however, the plungers 120, 130 are urged by the offset first and second taper portions 204, 206 at the reverse direction relative to the offset direction from the central axis of the barrel. As a result, plungers 120, 130 are inclined as illustrated in FIG. 6, and sliding portions 124, 134 of each plunger are stably contacted with the inner wall of the barrel.

In the second embodiment, the number of the wire turns in the central portion 202 is relatively large, so that the axial length in the central portion 202 is sufficiently ensured, as a whole the coil spring 200 is kept parallel with the axis of the barrel. In this case, regardless of the relationship of the orientations of each taper, the first and second taper portions 204, 206 may support the plungers 120, 130 independent of each other with the effective angle. Accordingly, the first and second taper portions 204, 206 may be offset by the optional taper angles $\Theta 1$, $\Theta 2$, not only by the rotational symmetry by 180 degree as shown in FIG. 9. For example, as described in the first embodiment, the first and second taper portions may be offset to the same side, and the angles $\Theta 1$, $\Theta 2$ may be different from each other. Furthermore, according to the second embodiment, the plungers 120, 130 can be inclined to make the sliding portions 124, 134 pressed to the inner wall of the barrel 110 sufficiently by the large number of wire turns than the first embodiment, even though the angles $\Theta 1$, $\Theta 2$ in the first and second taper portions 204, 206 are smaller. As a result of this, the small barrel with the diameter suited for the narrow pitch can be utilized.

Although the invention has been described with regard to certain specific preferred embodiments thereof, variations and modifications which may occur to those skilled in the art, should be considered to be within the scope of the present invention as defined in the appended claims.

Although the double-end probe pin is described in the embodiments, a single-end probe pin may be a substitute for it. In this case, since one of the plungers is fixed, this plunger can be integrated with the barrel. Additionally, the abutting portions 128, 138 of the plungers are the wedge-type of conical shape in the above embodiments. However, they may be an other shape such as pin type, pyramid type or the like. Furthermore, the abutting portions 128, 138 of the plungers can be formed with the bias-cut shape. Although the single probe pin is described in the above embodiments, those skilled in the art should understand that multiple probe pins can be mounted in the socket and the probe card.

What is claimed is:

1. A probe pin comprising:
    a conductive housing having a first end and a second end opposite the first end, and a space extending from the first end to the second end being formed internally;
    a first conductive plunger provided at the first end;
    a second conductive plunger provided at the second end; and
    a coil spring received in the housing to elastically support the first and second plungers;
    wherein the coil spring comprises a first coil portion having first coils, a second coil portion having second coils and being connected adjacent to a first end of the first coil portion and a third coil portion having third coils connected adjacent to a second end of the first coil portion, the second end opposite the first end,
    wherein the first coils each have a substantially equal diameter,
    wherein the second coils comprise coils with gradually reduced diameters relative to the diameter of the first coil portion,
    wherein the third coils comprise coils with gradually reduced diameters relative to the diameter of the first coil portion,
    wherein the second coil portion extends diagonally from the first coil portion and the third coil portion extends diagonally from the first coil portion,
    wherein an end of the second coil portion is connected to the first plunger,
    wherein an end of the third coil portion is connected to the second plunger
    wherein a central axis of the second coil portion that connects centers of each coil crosses a central axis of the first coil portion and a central axis of the third coil portion that connects centers of each coil crosses the central axis of the first coil portion, the central axis of the second coil portion being diagonal to the central axis of the first coil portion and the central axis of the third coil portion being diagonal to the central axis of the first coil portion,
    wherein the first plunger includes a first cylindrical sliding portion and a first conical wedge with the same axis as the first sliding portion that is connected to the second coil portion and the second plunger includes a second cylindrical sliding portion and a second conical portion with the same axis as the second sliding portion that is connected to the third coil portion, and
    wherein the central axis of the second coil portion extends away from the central axis of the first coil portion in a first direction and the central axis of the third coil portion extends away from the central axis of the first coil portion in a second direction that is opposite the first direction;
    wherein a first angle formed by central axes of the first and second coil portions equals a second angle formed by central axes of the first and third coil portions.

2. The probe pin according to claim 1, wherein a diameter d1 of a final end of the second coil portion is smaller than a diameter d of the first coil portion and wherein a diameter d2 of a final end of the third coil portion is smaller than the diameter d of the first coil portion.

3. The probe pin according to claim 2, wherein the diameter d1 of the final end of the second coil portion is equal with the diameter d2 of the final end of the third coil portion.

4. The probe pin according to claim 1, wherein the coil spring is symmetric with respect to a centerline orthogonal to the central axis of the first coil portion.

5. The probe pin according to claim 1, wherein the coil spring is rotationally symmetric with respect to the center of a central axis of the first coil portion.

6. The probe pin according to claim 1, wherein the first plunger comprises a cylindrical first contact portion having the same axis as the first sliding portion .

7. The probe pin according to claim 1, wherein the second plunger comprises a cylindrical second contact portion having a same axis as the second sliding portion.

8. A probe pin comprising:
    a conductive housing having a first end and a second end opposite the first end, and a space extending from the first end to the second end being formed internally;
    a first conductive plunger provided at the first end;
    a second conductive plunger provided at the second end; and
    a coil spring received in the housing to elastically support the first and second plungers respectively;
    wherein the coil spring comprises a first coil portion having first coils, a second coil portion having second coils and being connected adjacent to a first end of the first coil portion and a third coil portion having third coils connected adjacent to a second end of the first coil portion, the second end opposite the first end,
    wherein the first coils each have a substantially equal diameter,
    wherein the second coils comprise coils with gradually reduced diameters relative to the diameter of the first coil portion,
    wherein the third coils comprise coils with gradually reduced diameters relative to the diameter of the first coil portion,
    wherein the second coil portion extends diagonally from the first coil portion and the third coil portion extends diagonally from the first coil portion,
    wherein an end of the second coil portion is connected to the first plunger,
    wherein an end of the third coil portion is connected to the second plunger,
    wherein a central axis of the second coil portion that connects centers of each coil crosses a central axis of the first coil portion and a central axis of the third coil portion that connects centers of each coil crosses the central axis of the first coil portion, the central axis of the second coil portion being diagonal to the central axis of the first coil portion and the central axis of the third coil portion being diagonal to the central axis of the first coil portion,
    wherein the first plunger includes a first cylindrical sliding portion and a first conical wedge with the same axis as the first sliding portion that is connected to the second coil portion and the second plunger includes a second cylindrical sliding portion and a second conical portion with the same axis as the second sliding portion that is connected to the third coil portion, and wherein the central axis of the second coil portion extends away from the central axis of the first coil portion in a first direction and the central axis of the third coil portion extends away from the central axis of the first coil portion in a direction that is the same as the first direction;

wherein a first angle formed by central axes of the first and second coil portions equals a second angle formed by central axes of the first and third coil portions.

9. The probe pin according to claim 8, wherein a diameter d1 of a final end of the second coil portion is smaller than a diameter d of the first coil portion and wherein a diameter d2 of a final end of the third coil portion is smaller than the diameter d of the first coil portion.

10. The probe pin according to claim 9, wherein the diameter d1 of the final end of the second coil portion is equal with the diameter d2 of the final end of the third coil portion.

11. The probe pin according to claim 8, wherein the coil spring is symmetric with respect to a centerline orthogonal to the central axis of the first coil portion.

12. The probe pin according to claim 8, wherein the coil spring is rotationally symmetric with respect to the center of a central axis of the first coil portion.

13. The probe pin according to claim 8, wherein the first plunger comprises a cylindrical first contact portion having the same axis as the second sliding portion.

* * * * *